United States Patent
Henzler et al.

(10) Patent No.: US 8,228,219 B2
(45) Date of Patent: Jul. 24, 2012

(54) TIME-TO-DIGITAL CONVERTER WITH CALIBRATION

(75) Inventors: Stephan Henzler, Munich (DE);
Thomas Mayer, Linz (AT); Christian Wicpalek, Linz (AT)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 12/816,158

(22) Filed: Jun. 15, 2010

(65) Prior Publication Data

US 2011/0304361 A1   Dec. 15, 2011

(51) Int. Cl.
*H03M 1/10* (2006.01)
(52) U.S. Cl. ............ 341/120; 341/155
(58) Field of Classification Search .......... 341/155, 341/157, 166, 141, 118, 120
See application file for complete search history.

(56) References Cited

U.S. PATENT DOCUMENTS

| | | | |
|---|---|---|---|
| 6,868,047 B2 * | 3/2005 | Sartschev et al. | 368/118 |
| 7,609,756 B2 * | 10/2009 | Wood | 341/155 |
| 7,791,525 B2 * | 9/2010 | Rivoir | 341/166 |
| 7,928,888 B1 * | 4/2011 | Chiu et al. | 341/161 |
| 2003/0160719 A1 * | 8/2003 | Hancock | 342/368 |
| 2008/0069292 A1 * | 3/2008 | Straayer et al. | 377/46 |
| 2009/0267668 A1 | 10/2009 | Lin | |
| 2010/0066421 A1 | 3/2010 | Geng | |
| 2010/0260242 A1 * | 10/2010 | Abe et al. | 375/219 |

OTHER PUBLICATIONS

Staszewski et al.: "1.3V 20ps Time-to-Digital Converter for Frequency Synthesis in 90nm CMOS"; IEEE Transactions on circuits and systems—II: Express briefs, vol. 53, No. 3, Mar. 2006.

* cited by examiner

*Primary Examiner* — Peguy Jean Pierre
(74) *Attorney, Agent, or Firm* — SpryIP, LLC

(57) ABSTRACT

Time-to-digital converter arrangements and corresponding methods as well as applications thereof are described. The time-to-digital converter in a first mode is coupled with a calibration signal generator and in a second mode is coupled with signal input.

26 Claims, 2 Drawing Sheets

TIME-TO-DIGITAL CONVERTER WITH CALIBRATION

BACKGROUND OF THE INVENTION

The present application relates to time-to-digital converters and to circuit arrangements and apparatuses comprising time-to-digital converters as well as corresponding methods.

Time-to digital converters (TDCs) are electronic circuits which determine a time difference between predetermined features of two signals supplied to the time-to-digital converter. The features may for example comprise rising edges of the signals, falling edges of the signals, transitions from a logic zero to a logic one in the signals or transitions from a logic one to a logic zero in the signals.

Time-to-digital converters are for example employed in digital phase-locked loops (PLLs) as phase detectors for determining a phase difference between a reference signal and a signal fed back from an oscillator or in pulse modulation analog-to-digital converters.

In some cases, time-to-digital converters comprise a digital delay line, wherein after each delay element a sampling for example by digital comparators is performed. One of the two signals fed to the time-to-digital converter is fed to the delay line and propagates from delay element to delay element, which may be implemented as gates such that the signal then propagates from gate to gate. The other signal of the two signals fed to the time-to-digital converter triggers the comparators that sample the current state of the respective elements of the delay line. The number of delay elements B that are passed by the first signal before the second signal triggers the comparator is a measure for the time difference of the relevant features between the signals. This can be expressed by $$B = k_{TDC} \cdot \Delta T,$$

where B as mentioned above is the number of delay elements, i.e. the value, measured by the time-to-digital converter, and $\Delta T$ the time difference between the two relevant features of the signals. $k_{TDC}$ is the gain of the time-to-digital converter. For an absolute determination of $\Delta T$, this gain has to be known. However, effects like noise on a power supply voltage supplying the time-to-digital converter and noise in the elements or components of the time-to-digital converter may temporarily change the signal propagation velocity in the delay line and, therefore, the gain of the time-to-digital converter. In particular, low frequency noise, for example 1/f noise, may cause a slow drift of the time-to-digital converter gain. This may lead to a large long time error and, therefore, may adversely affect the functioning of a circuit arrangement like a PLL employing the time-to-digital converter.

DETAILED DESCRIPTION OF THE INVENTION

Figure 1:
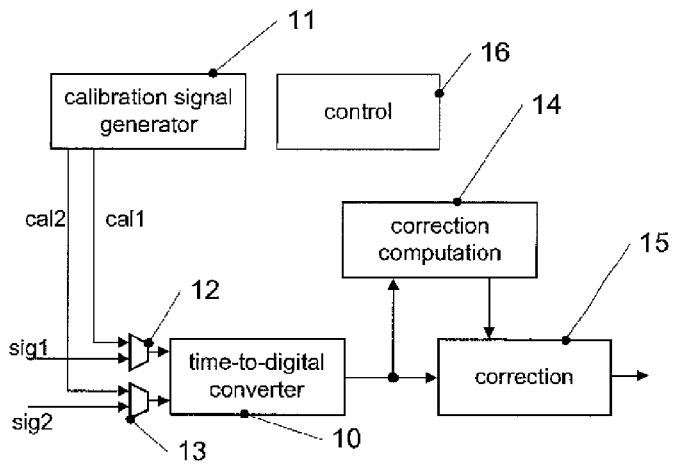
FIG. 1 shows a block diagram of a time-to-digital converter arrangement according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings. It is also to be understood that in the following description of embodiments any direct connection or coupling between functional blocks, devices, components, circuit elements or other physical or functional units shown in the drawings as described herein could also be implemented by an indirect connection or coupling, i.e. a connection or coupling with one or more additional intervening elements.

Furthermore, it should be appreciated that functional blocks or units shown in the drawings may be implemented as separate circuits in some embodiments, but may also be fully or partially implemented in a common circuit in other embodiments. In other words, the provision of a plurality of functional blocks in the drawings is merely intended to facilitate the understanding of the respective embodiment, but is not to be construed as indicating that the functional blocks have to be implemented separately from each other. For example, some or all of the functional blocks may be implemented in a common integrated circuit, or some functional blocks may be implemented by programming a processor like a digital signal processor accordingly. Furthermore, the arrangement of functional blocks in the drawings has been chosen to provide a clear understanding of the respective embodiment and is not to be construed as necessarily indicating the relative locations of the functional blocks in an actual implementation.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features, alternative features and/or additional features.

In some embodiments, an arrangement comprising a time-to-digital converter comprising a first input, a second input and an output is provided. Multiplexers or other switching circuitry is coupled with the first input and the second input to selectively supply calibration signals generated by a calibration signal generator or actual measurement signals to the time-to-digital converter. In some embodiments, correction circuitry may be coupled with the output of the time-to-digital converter to perform a correction of the output signal based on the calibration signals.

In some embodiments, such an arrangement is used in a phase-locked loop. In this case, the calibration signal generator may provide calibration signals which are adapted, for example resemble as regards their frequency or time intervals, to output signals of an oscillator of the phase-locked loop or signals derived therefrom. To this end, the calibration signal generator may be coupled with the oscillator. In other embodiments, a time-to-digital converter arrangement may be used in an analog-to-digital converter or other data converter.

Turning now to the figures, in FIG. 1 a time-to-digital converter arrangement according to an embodiment is shown. The arrangement of FIG. 1 comprises a time-to-digital converter 10. The time-to-digital converter 10 comprises a first input, a second input and an output.

An output of a first multiplexer 12 is coupled to the first input of time-to-digital converter 10, and an output of a second multiplexer 13 is coupled to the second input of time-to-digital converter 10.

The circuit arrangement of FIG. 1 furthermore comprises a calibration signal generator 11 which is configured to generate two calibration signals cal1, cal2. A first output of calibration signal generator supplying signal cal1 is coupled to a first input of first multiplexer 12, and a second output of calibration signal generator 11 supplying signal cal2 is coupled to a first input of second multiplexer 13. An input for a first signal sig1 is coupled with a second input of first multiplexer 12, and a second input for supplying a signal sig2 is coupled with a second input of second multiplexer 13.

The output of time-to-digital converter 10 is coupled with a correction computation circuit 14 and a correction circuit 15 being an example for correction circuitry as shown in FIG. 1.

The circuit arrangement of FIG. 1 may operate in a first mode which is a calibration mode and a second mode which is a regular measurement mode. In the first mode, multiplexers 12 and 13 are switched to supply the calibration signals cal1, cal2 to the first and second input of time-to-digital converter 10, respectively. The calibration signals cal1, cal2 have predetermined time differences between their relevant features, for example between rising edges (which may represent transitions from logic zero to logic one) or between falling edges (which may represent state transitions from logic one to logic zero). The output of time-to-digital converter 10 is then analyzed by correction computation circuit 14. Correction computation circuit 14 compares the measured values with the predetermined time intervals and, in case of a mismatch, calculates corresponding correction values, for example in the form of a table. In some embodiments, correction factors may be stored or provided in the form of a linear approximation of the values actually calculated by correction computation circuit 14. In some embodiments, between the measurement points, i.e. between the predetermined time interval supplied by calibration signal generator 11, an interpolation may be performed. Correction computation circuit 14 supplies the correction values to correction circuit 15.

In some embodiments, the calibration result may be averaged over a limited time to cancel variations due to white noise.

In the second mode, which is the regular mode, signals sig1, sig2 are supplied to the first and second input of time-to-digital converter 10 via the first and second multiplexers 12, 13. For example, signal sig1 may be a reference signal and signal sig2 may be a feedback signal. Time-to-digital converter 10 outputs a value characterizing a time difference between relevant features in signal sig1, sig2 like rising edges, falling edges, or state transitions. Based on the correction information obtained during calibration mode, correction unit 15 corrects the values output by time-to-digital converter 10 accordingly. In some embodiments, the approximations and/or interpolations described above with reference to correction computation circuit 14 may alternatively be performed in correction circuit 15. For example, correction computation circuit 14 may calculate the instantaneous, i.e. current, gain of time-to-digital converter 10 and compare this instantaneous gain with a nominal value. Correction circuit 15 then during the second mode performs a gain correction by compensating for the deviation.

A control circuit 16 may be provided which controls the switching between the first mode and the second mode. For example, a calibration may be performed in regular intervals, or based on the difference between a previous calibration and a current calibration, a time until the next calibration may be calculated. In other embodiments, additionally or alternatively calibrations may be performed upon request from external entities. It should be noted that control 16 need not be implemented separately, but may also form part of calibration signal generator 11, correction computation circuit 14 or correaction circuit 15. In some embodiments, control 16 may control calibration signal generator 11 not to generate calibration signals in the second mode. Furthermore, in some embodiments, a range of time intervals represented by signals cal1, cal2, generated by calibration signal generator 11 may be adjustable, for example to adapt the calibration to a particular application.

Figure 2:
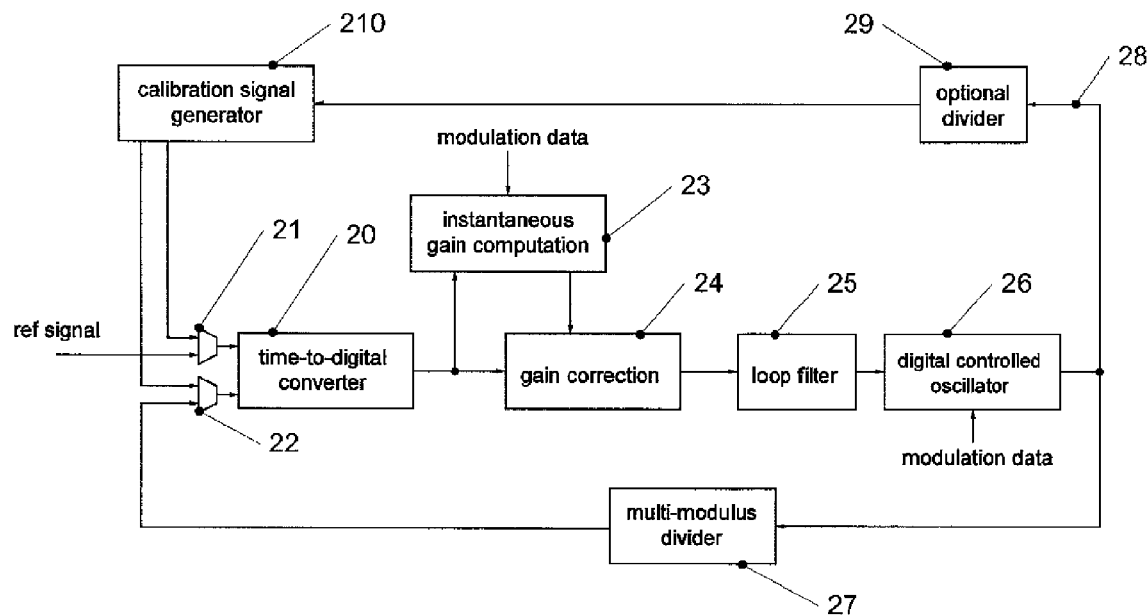
FIG. 2 shows a block diagram of a phase locked loop according to an embodiment.

In FIG. 2, a phase-locked loop (PLL) according to an embodiment is shown.

The phase-locked loop shown in FIG. 2 comprises inter alia a time-to-digital converter 20, a first multiplexer 21, a second multiplexer 22, a calibration signal generator 210, an instantaneous gain computation 23 serving as correction computation circuitry and a gain correction 24 serving as correction circuitry, the function of which is similar to the function of time-to-digital converter 10, first multiplexer 12, second multiplexer 13, calibration signal generator 11, correaction computation circuit 14 and correction circuit 15 in FIG. 1. In particular, via multiplexer 21 and 22 the phase-locked loop shown in FIG. 2 may switch between a first mode which is a calibration mode and a second mode which is a regular mode. The switch between the first mode and the second mode may be controlled by a control (not shown) similar to control 16 of FIG. 1. As the calibration procedure by supplying signals from calibration signal generator 210 works similar to what was already described with respect to FIG. 1, it will not be described again in detail, and only some (optional) additional features will be described in the following.

In the second mode, time-to-digital converter 20 serves to determine a phase difference between a reference signal ref signal and a signal output by a multi-modulus divider 21 by determining a time difference between relevant features of the two signals. The output of time-to-digital converter 20 is corrected by gain correction 24 as explained above with respect to FIG. 1 based on correction data obtained during the first mode, and the thus corrected signal is set to a loop filter 25, which may be a low path filter. An output signal of loop filter 21 is fed to a control input of a digitally controlled oscillator (DCO) 26. With such digitally controlled oscillators, a frequency of an output signal of the digital controlled oscillator depends on a signal supplied to the control input. An output signal of the digital controlled oscillator 26 is fed to an input of multi-modulus divider 27, which divides the frequency of the output signal by a predetermined or adjustable division factor, which may, but need not be, an integer factor. In a locked-in state, therefore, the output signal of digital controlled oscillator 26 has a frequency which corresponds to the frequency of the reference signal ref signal multiplied by the division factor of multi-modulus divider 27.

Optionally, a feedback path 28 may be provided which supplies the output signal of digitally controlled oscillator 26, possibly via an optional frequency divider 29, to calibration signal generator 210. Therefore, calibration signal generator 210 obtains information regarding the frequency of the output signal of digitally controlled oscillator 26, for example during operation in the first mode, and can use this information to provide calibration signals in the second mode which have a frequency similar to the frequencies used in the first mode, such that the operating range in calibration matches the operating range during the second mode, i.e. regular mode. Additionally or alternatively, calibration signal generator 210 may generate calibration signals representative of time intervals which are similar to time intervals occurring during regular operation.

Furthermore, in some applications the output signal of digital controlled oscillator 26 may be modulated depending on modulation data as indicated in FIG. 2. Information regarding the modulation data may also be supplied to instantaneous gain computation 23 serving as correction computation unit such that the modulation can be taken into account during calibration.

Otherwise, the variants and alternatives discussed with reference to FIG. 1 also apply to the embodiment of FIG. 2.

While in the embodiment of FIG. 2 a phase-locked loop is shown as an example for a frequency synthesizer circuit employing a time-to-digital converter, time-to-digital converter arrangement similar to the one shown may also be used in other frequency synthesizers.

A further application where time-to-digital converters may be used are time-to-digital converter based data converters like analog-to-digital converters or digital-to-analog converters. As an example, in FIG. 3 an embodiment of an analog-to-digital converter is shown.

Figure 3:
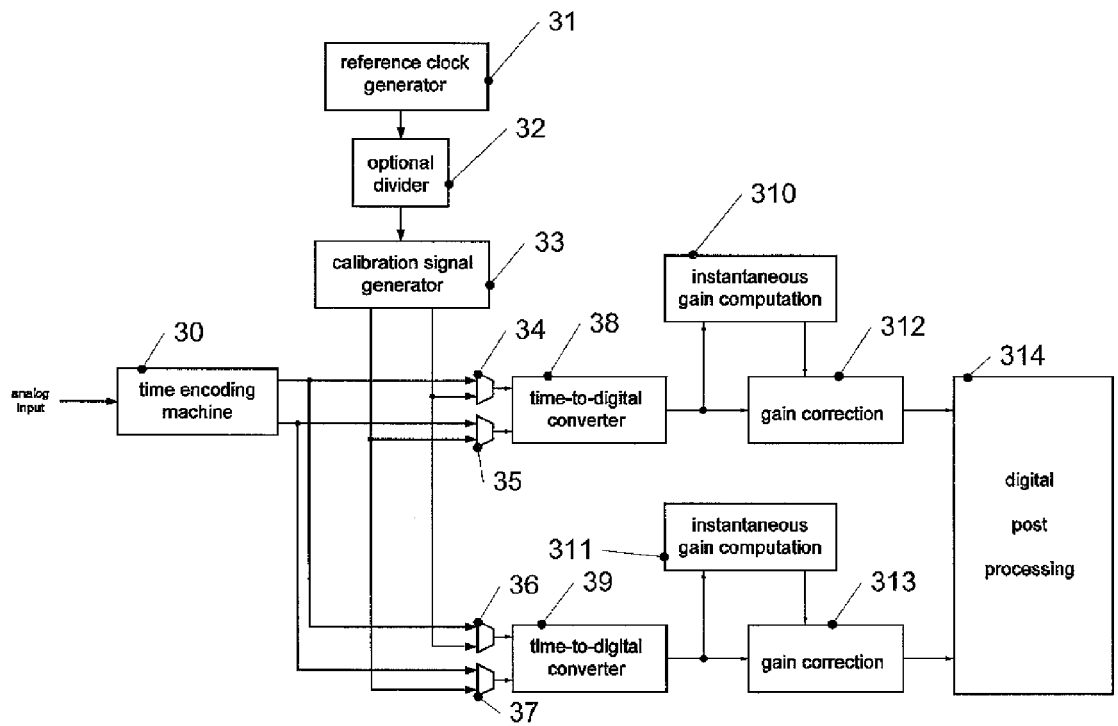
FIG. 3 shows a block diagram of an analog-to-digital converter according to an embodiment.

The analog-to-digital converter of FIG. 3 comprises an analog input via which an analog signal may be fed to a time encoding machine 30, which may for example perform a pulse code modulation to output a pulse code modulated output signal and the inverse signal thereof. A first output of time encoding machine 30 is coupled with a first input of a first multiplexer 34 and a first input of a third multiplexer 36. A second output of time encoding machine 30 is coupled with a first input of a second multiplexer 35 and a first input of a fourth multiplexer 37. Outputs of first multiplexer 34 and second multiplexer 35 are coupled to first and second inputs of a first time to digital converter 38, respectively, and outputs of third multiplexers 36 and fourth multiplexer 37 are coupled with first and second inputs of a second time-to-digital converter 39.

The analog-to-digital converter of FIG. 3 furthermore comprises a calibration signal generator 33 configured to generate calibration signals for calibrating first time-to-digital converter 38 and second time to digital converter 39. A first output of calibration signal generator 33 is coupled with second inputs of first multiplexer 34 and third multiplexer 36, and a second output of calibration signal generator 33 is coupled with second input of second multiplexer 35 and fourth multiplexer 37.

In the analog-to-digital converter of FIG. 3, a first instantaneous gain computation 310 and a first gain correction 312 are coupled to an output of time-to-digital converter 38 and a second instantaneous gain computation 311 and a second gain correction 313 are coupled to an output of time-to-digital converter 39. An output of first gain correction 312 and an output of second gain correction 313 are coupled with a digital post-processing circuit 314, which determines a digital value corresponding to an analog value of a signal fed to the analog input.

Via multiplexers 34 through 37 the analog-to-digital converter of FIG. 3 may be switched between a first mode which is a calibration mode and a second mode which is a regular mode for converting an analog signal to a digital signal. In the calibration mode, first time-to-digital converter 38 and second time-to-digital converter 39 are calibrated by using signals from the calibration signal generator 33 and analyzing the output through first instantaneous gain computation 310 and second instantaneous gain computation 311, and in the second mode the output signal of first time-to-digital converter 38 and second time-to-digital converter 39 is corrected by first gain correction 312 and second gain correction 313, respectively, in the manner already described above with reference to FIGS. 1 and 2. The variations and modifications described with reference to FIGS. 1 and 2 are also applicable to the embodiment of FIG. 3.

In the embodiment of FIG. 3, a reference clock generator 31 may be coupled with calibration signal generator 33, possibly by an optional divider 32, such that calibration signal generator 33 generates the calibration signal based on a clock signal supplied by the reference clock generator. Reference clock generator 31 and/or calibration signal generator 33 may be adjustable to provide calibration signals with a frequency and/or representative of time differences similar to values used in the actual analog-to-digital conversion.

Also in the embodiment of FIG. 3, a control circuit similar to the one discussed with reference to FIG. 1 may be provided to control and/or determine intervals for calibration. Furthermore, while a single calibration signal generator 33 is provided both for calibration of first time-to-digital converter 38 and second time-to-digital converter 39, in other embodiments separate calibration signal generators may be provided. In still other embodiments, more than two time-to-digital converters may be calibrated using signals from the same calibration signal generator.

While in FIG. 3 an analog-to-digital converter has been shown, time-to-digital converters with calibration as shown above may also be used in other kinds of data converters like digital-to-analog converters.

Figure 4:
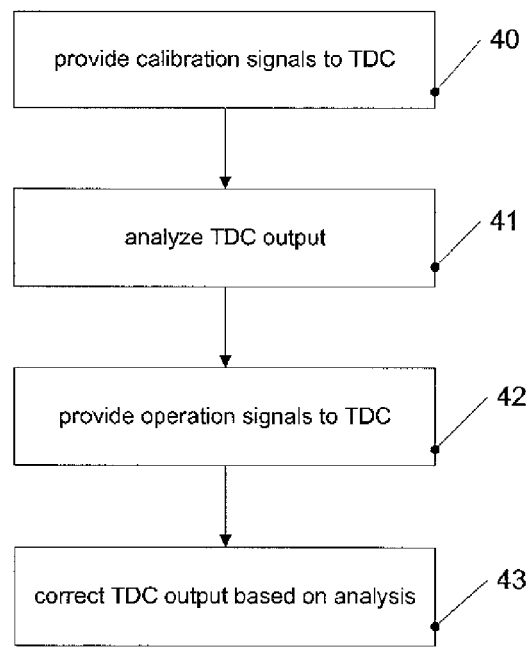
FIG. 4 shows a flow diagram illustrating a method according to an embodiment.

In FIG. 4, a flow diagram illustrating a method according to an embodiment is shown. The method of FIG. 4 may for example be implemented in the circuit arrangements and devices of FIGS. 1 to 3, but may also be implemented independently therefrom. Furthermore, while the method is described as a sequence of actions or steps, the actions or steps may also be performed in an order different to the one shown.

At 40, calibration signals are provided to a time-to-digital converter. The calibration signals may be generated by a calibration signal generator and may be adapted to a desired operating range of the time-to-digital converter.

At 41, the output of the time-to-digital converter in response to the calibration signals is analyzed.

At 42, operation signals, for example a reference signal and a feedback signal from a phase-locked loop or a signal based on an analog input signal to be converted to a digital converter, is provided to the time-to-digital converter. At 43, the output of a time-to-digital converter is corrected based on the analysis performed at 41.

The calibration of this method may be repeated periodically or in intervals which may be calculated based on an amount of calibration needed, a change of calibration from one calibration to the next or also based on feedback from other units using the output signals of the time-to-digital converter.

As can be seen from the above description of embodiments, a plurality of modifications and variations are possible in different embodiments of the present invention. Therefore, the embodiments are not to be construed as limiting the scope of the present application.

What is claimed is:

1. An apparatus, comprising:
   a first signal input,
   a second signal input,
   a calibration signal generator,
   a time-to-digital converter, and
   switching circuitry configured to couple said first signal input and said second signal input with said time-to-digital converter in a first mode and to couple said calibration signal generator with said time-to-digital converter in a second mode.

2. The apparatus of claim 1, wherein said switching circuitry comprises a first multiplexer, a first input of said first multiplexer being coupled with an first output of said calibration signal generator, a second input of said first multiplexer being coupled with said first signal input and an output of said first multiplexer being coupled with a first input of said time-to-digital converter, and a second multiplexer, a first input of said second multiplexer being coupled with a second output of said calibration signal generator, a second input of said second multiplexer being coupled with said second signal input and an output of said second multiplexer being coupled with a second input of said time-to-digital converter.

3. The apparatus of claim 1, further comprising correction circuitry coupled to an output of said time-to-digital converter, said correction circuitry being configured to correct an output of the time-to-digital converter in the second mode based on calibration results obtained in the first mode.

4. The apparatus of claim 3, wherein the correction is based on a linear approximation.

5. The apparatus of claim 1, further comprising correction computation circuitry coupled to an output of said time-to-digital converter and being configured to determine correction values based on an output of the time-to-digital converter in the first mode.

6. The apparatus of claim 1, further comprising control circuitry configured to repeatedly switch the apparatus between the first mode and the second mode.

7. The apparatus of claim 1, wherein said calibration signal generator is configured to generate calibration signals based on information regarding signals used in the apparatus during the second mode.

8. A frequency synthesizer, comprising:
a reference signal input,
a feedback signal input,
a calibration signal generator,
a time-to-digital converter, and
switching circuitry configured to couple said calibration signal generator with said time-to-digital converter in a first mode and to couple said first signal input and said second signal input with said time-to-digital converter in a second mode, and oscillation circuitry, wherein said oscillation circuitry is configured to generate an output signal with a frequency depending on an output of said time-to-digital converter.

9. The frequency synthesizer of claim 8, further comprising correction circuitry coupled to an output of said time-to-digital converter, said correction circuitry configured to correct an output of the time-to-digital converter in the second mode based on calibration results obtained in the first mode.

10. The frequency synthesizer of claim 8, further comprising a loop filter coupled between an output of said time-to-digital converter and a control input of said oscillation circuitry.

11. The apparatus of claim 8, wherein said oscillator circuitry comprises a digital controlled oscillator.

12. The frequency synthesizer of claim 8, wherein an output of said oscillator circuitry is coupled with an input of said calibration signal generator, said calibration signal generator being configured to generate calibration signals depending on the received output.

13. The frequency synthesizer of claim 8, further comprising correction computation circuitry coupled to an output of said time-to-digital converter and being configured to determine correction values based on an output of the time-to-digital converter in the first mode, wherein said correction computation circuitry is further configured to calculate said correction values based on a modulation of an output signal of said oscillator circuitry.

14. A data converter, comprising
a data input,
a data output,
a calibration signal generator,
a time-to-digital converter, and
switching circuitry, said switching circuitry being configured to couple said data input with at least one input of said time-to-digital converter in a first mode and to couple said calibration signal generator to said time-to-digital converter in a second mode.

15. The apparatus of claim 14, wherein said data converter is one of an analog-to-digital converter or a digital-to-analog converter.

16. The apparatus of claim 14, further comprising a time encoding machine coupled between said data input and said time-to-digital converter in said first mode.

17. The apparatus of claim 16, wherein said time encoding circuitry comprises a pulse modulator.

18. The apparatus of claim 14, further comprising a further time-to-digital converter and further switching circuitry, said further switching circuitry being configured to couple said data input to said further time-to-digital converter in the first mode and to couple said calibration signal generator to said time-to-digital converter in the second mode.

19. The apparatus of claim 14, further comprising digital post-processing circuitry coupled to an output of said time-to-digital converter.

20. A method, comprising:
providing calibration signals to a time-to-digital converter,
analyzing the time-to-digital converter output,
providing operation signals to the time-to-digital converter, and
correcting the time-to-digital converter output based on the analysis, wherein the provision of calibration signals and the analyzing of the time-to-digital converter output is performed in intervals during operation of the time-to-digital converter.

21. The method of claim 20, wherein providing calibration signals comprises generating calibration signals having similar properties than the operation signals.

22. The method of claim 20, further comprising controlling an oscillator based on the corrected output of the time-to-digital converter.

23. The method of claim 22, further comprising providing the calibration signals based on an output signal of the oscillator.

24. The method of claim 22, further comprising correcting the time-to-digital converter output based on a modulation of said oscillator.

25. The method of claim 20, further comprising performing a data conversion using the time-to-digital converter.

26. The method of claim 20, wherein the time-to-digital converter determines a time difference between features of signals during the operation of the time-to-digital converter.

* * * * *